Nov. 7, 1967 P. A. ILES 3,350,775

PROCESS OF MAKING SOLAR CELLS OR THE LIKE

Filed Oct. 3, 1963

INVENTOR
PETER ALBERT ILES
BY
Lyon & Lyon
ATTORNEYS

3,350,775
PROCESS OF MAKING SOLAR CELLS OR THE LIKE

Peter Albert Iles, Arcadia, Calif., assignor to Hoffman Electronics Corporation, El Monte, Calif., a corporation of California Filed Oct. 3, 1963, Ser. No. 313,478
3 Claims. (Cl. 29—572)

This invention relates to semiconductor devices and more particularly relates to photovoltaic devices such as solar cells and a process of making them.

In United States patent application Ser. No. 184,347 filed Apr. 2, 1962, by Bernd Ross et al. and entitled, Solar Cell Device, there is disclosed a solar cell having a greater radiation receiving area than those theretofore obtainable. The construction of these cells also facilitated their flat mounting on a large panel. Cells according to that application are formed with a P-type conductivity region covering the entire top surface of a solar cell, continuing completely around one edge, and extending a small distance onto the bottom surface of the cell. An ohmic contact covers the edge and bottom portions of the P-type region and connects with grid strips formed on the top surface of the P-type region. A second ohmic contact covers the entire remaining surface of the bottom of the cell except for a shallow groove which runs across the bottom of the cell and separates the P and N regions and the two contacts.

According to the present invention, an improved process is provided for forming cells of this general type. The process utilizes various masking steps, including the formation of an oxide mask, to permit great flexibility in the applying of diffused layers and contact areas. The use of the present process eliminates the need for etching the P-N junction and also permits the use of simple masks and milder or less reactive etching and/or cleaning solutions. The process also provides protection for the P-N junction where it comes to the surface of the cell.

It is therefore an object of the present invention to provide a process for forming solar cells and similar photovoltaic devices.

It is also an object of the present invention to provide such a process which permits the use of relatively mild etching or cleaning agents.

It is another object of the present invention to provide such a process for forming a solar cell having a P-N junction which is wrapped around the top, one edge and a minor portion of the bottom of a semiconductor blank.

It is a further object of the present invention to provide an improved solar cell having a relatively large radiation receiving area.

These and other objects and advantages of the present invention will become more apparent upon reference to the accompanying description and drawings in which.

Figures 1, 2, 3, 4:
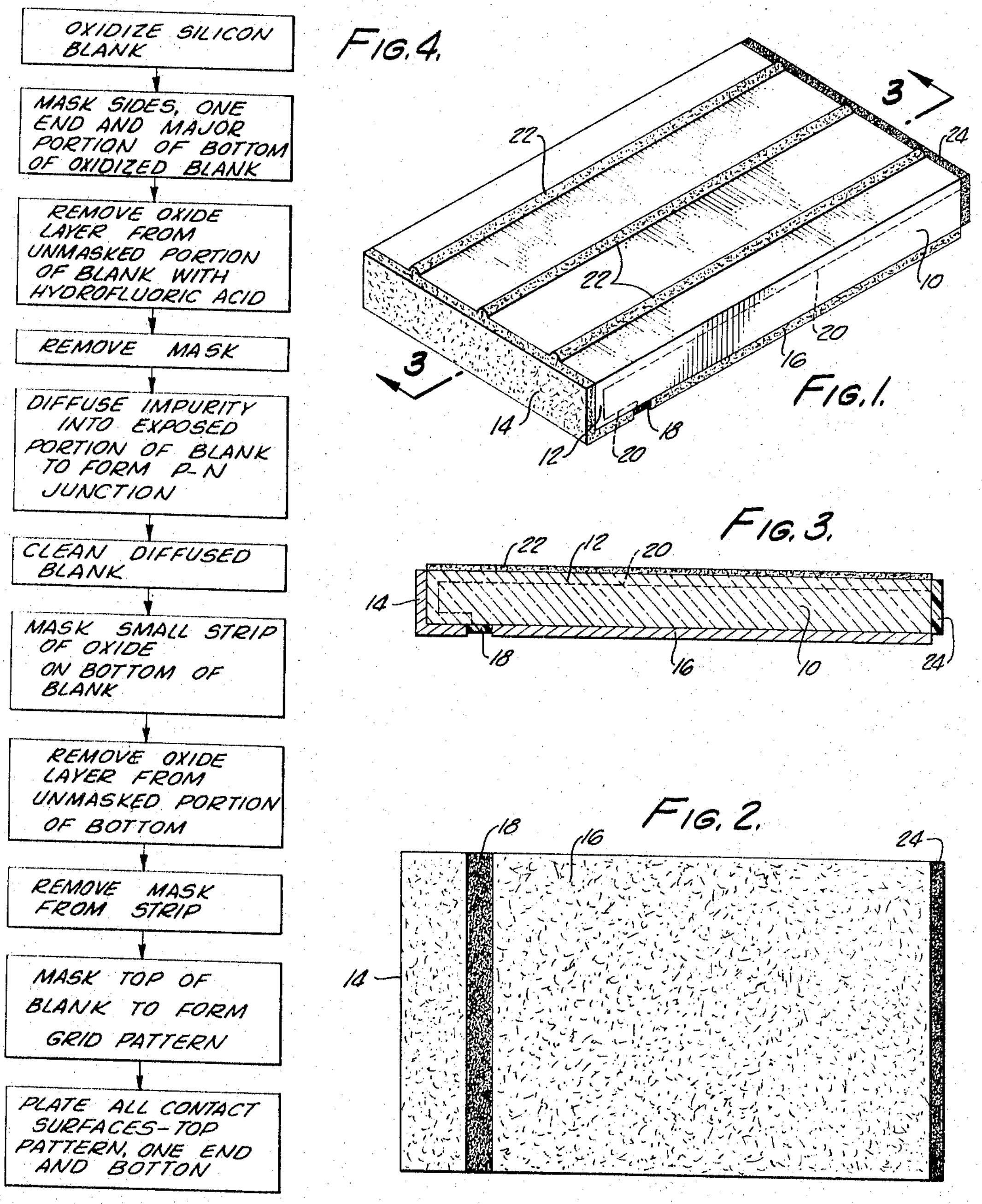
FIGURE 1 is a perspective view of a first type of solar cell formed according to the present invention.
FIGURE 2 is a bottom plan view of the solar cell of FIGURE 1.
FIGURE 3 is a cross-sectional view taken along lines 3—3 of FIGURE 1.
FIGURE 4 is a flow diagram showing the steps in the process of the present invention.

Turning now to the FIGURES 1, 2 and 3, there is shown a blank of semiconductor material 10, preferably silicon, of a first conductivity type having formed therein a region 12 of the opposite conductivity type. This region 12 covers the entire top surface of the blank 10, continues around one edge, and extends a small distance onto the bottom surface of the blank. A first ohmic contact 14 covers the edge and bottom portion of the region 12 while a second ohmic contact 16 covers the majority of the remainder or major portion of the bottom of the blank 10. The contacts 14 and 16 are separated by a thin strip of silicon dioxide 18.

The silicon dioxide strip 18 overlies the area where the P-N junction 20 between the two regions of opposite conductivity type comes to the surface of the blank. The upper surface of the region 12 is provided with a number of grid strips 22 which connect with the ohmic contact 14. A layer 24 of silicon dioxide is present on the end of the blank 10 opposite the contact 14.

As pointed out in the aforementioned patent application of Ross et al., a cell formed in this fashion provides a maximum of surface exposure for receiving radiation as no contact strip along one edge is necessary. The surface area can be even further increased by deleting the grid strips 22. However, these strips increase the efficiency of the cell by decreasing the average distance that the current carriers need travel before being collected by a metallic contact. This has the effect of lowering the series resistance presented to the current carriers and thus increasing the cell efficiency.

The above described cell is made in the following manner, reference being had to the flow diagram of FIGURE 4. A silicon blank of either conductivity type for example, of N type is covered or masked on all surfaces with a layer of silicon dioxide. This oxide mask can be applied by any of the conventional methods known to those skilled in the art. A mask of wax, tape or other suitable material is then applied to one end, the major portion of the bottom and the corresponding major portion of the sides of the blank. The masking on the sides of the blank can be carried to the end if desired.

The silicon dioxide is now removed from the unmasked portion of the blank with hydrofluoric acid and the mask then removed from the remainder of the blank. An impurity of the opposite conductivity type is then diffused into the exposed portion of the blank to form a region of opposite conductivity type with the resultant P-N junction. The blank 10 may now be subjected to whatever post diffusion cleaning and scale removal is necessary.

A small strip of the oxide on the bottom of the blank adjoining the now diffused minor portion of the bottom is now masked with tape or other suitable material. The oxide mask on the remainder of the major portion of the bottom of the blank is now removed for example, by use of hydrofluoric acid. If desired, the diffused minor portion of the bottom may be masked as well as the small strip of oxide and the remaining oxide removed by sandblasting.

The mask is now removed and the desired grid pattern formed on the top of the blank by any conventional masking technique such as by use of ink or photo resist. All of the contact surfaces are now plated with a suitable contact material such as a gold-nickel alloy. The narrow strip of silicon dioxide remaining on the bottom of the blank assures that the two contacts are kept separate and protects the area along which the P-N junction comes to the surface and prevents this junction from being shorted by the plating. The layer 24 of oxide may now be removed if so desired.

By constructing a solar cell according to the process described above, the use of any etching or cleaning solution stronger than hydrofluoric acid may be eliminated. Since this is the case, the masks which are used can be much less resistant than the types normally used where solutions containing nitric acid are used. These less resistant masks are much easier to apply and particularly to remove, and thus considerably simplify and speed up the manufacturing process. The process also eliminates the need for etching the silicon blank itself to form a groove or separation between the contacts and to prevent the shorting of the junction by the wrap-around contact. The elimination of this etching is a desirable feature as such etching can sometimes have a deleterious effect on the blank and must in all cases be carefully controlled. The narrow oxide strip on the bottom of the blank formed by use of the process of the present invention protects the P-N junction from being shorted by the plated contacts and also assures that the two contacts will be electrically separated without the necessity of the further step of removing some of the plating.

Figure 5:
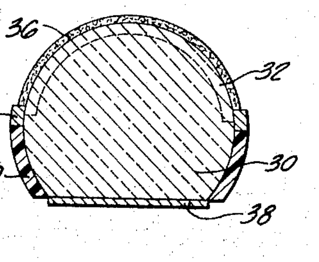
FIGURE 5 is a cross-sectional view of a second type of solar cell made according to the present invention.

Referring now to FIGURE 5, there is shown a spherical photovoltaic device such as that disclosed in U.S. Patent No. 2,904,613 issued Sept. 15, 1959, to Maurice E. Paradise but constructed by the previously described process. As can be seen, this device comprises a partially spherical body of semiconductor material 30 of a first conductivity type having formed therein a region 32 of a second conductivity type. This region 32 extends over the upper hemisphere of the body 30. An ohmic contact 34 in the form of an annular ring is formed on the region 32, as is a plurality of grid strips 36, only one of which is shown.

A second ohmic contact 38 is plated on the bottom of the body 30, which, as illustrated, has been flattened by lapping or the like. The contacts 34 and 38 are separated by an annular strip of silicon dioxide 40. This device is made in the same manner as the device of FIGURES 1–3. A spherical body of semiconductor material of a first conductivity type is completely covered with a layer of silicon dioxide. The lower hemisphere is then masked and the silicon dioxide is removed from the unmasked upper portion by hydrofluoric acid. The mask is then removed from the lower hemisphere and an impurity of the opposite conductivity type is diffused into the exposed upper portion of the spherical body to form a P-N junction therein. The body is then subjected to post-diffusion cleaning.

A portion of the lower hemisphere of the body is now exposed. This can be done by masking an annular strip of the oxide and then removing the remainder of the oxide by means of hydrofluoric acid or by sandblasting or may be done by simply lapping the bottom of the sphere. In either case, an exposed area of silicon is formed on the bottom hemisphere, this exposed area being separated from the upper hemisphere by an annular strip of silicon dioxide. The upper hemisphere is now masked to form a grid and contact pattern and then all of the contact surfaces are plated. As was the case with the embodiment of FIGURES 1 through 3, the resultant device has a pair of contacts which are separated by an oxide strip, the oxide strip also protecting the P-N junction and preventing it from being shorted by the plating.

While the above description deals primarily with solar cells, it should be obvious that this invention is equally useful in forming any similar photovoltaic device. The invention may also be embodied in other specific forms without departing from the spirit or essential characteristics thereof. The present embodiments are therefore to be considered as illustrative and not restrictive, the scope of the invention being indicated by the appended claims and all changes which come within the meaning and range of equivalents of the claims are therefore intended to be embraced therein.

I claim:

1. A process of forming a photovoltaic device, comprising: forming an oxide layer on all surfaces of a blank of semi-conductor material of a first conductivity type, removing the oxide layer from the top, one end and a minor portion of the bottom of said blank to form an exposed area, diffusing an impurity of the opposite conductivity type into said exposed area to form a junction in said blank, masking a strip of the remaining oxide layer adjacent said diffused area and overlying the area where said junction comes to the surface of said blank, removing the oxide layer from the remainder of the bottom of said blank to form an exposed area, and plating metallic contacts on the diffused end and bottom areas of said blank and on said exposed area, said contacts being separated and prevented from shorting said junction by the remaining oxide strip.

2. A process of forming a photovoltaic device, comprising: forming an oxide layer on all surfaces of a blank of semiconductor material of a first conductivity type, masking one end, a major portion of the bottom and a major portion of each side of said oxidized blank, removing the oxide layer from the unmasked portions of said blank, diffusing an impurity of an opposite conductivity type into the oxide free portion of said blank to form a junction therein, masking a strip of the oxide layer remaining on the major portion of said bottom adjacent said diffused area and overlying the area where said junction comes to the surface of said blank, removing the oxide layer from the remaining unmasked portion of said bottom of said blank to form an exposed area and plating metallic contacts on the diffused end and bottom areas of said blank and on said exposed area, said contacts being separated and prevented from shorting said junction by the remaining oxide strip.

3. A process of forming a solar cell or the like, comprising: forming an oxide layer on all surfaces of a blank of silicon of a first conductivity type, masking one end, a major portion of the bottom and a major portion of each side of said oxidized blank, removing said mask, diffusing an impurity of an opposite conductivity type into the oxide free top, end and minor bottom portions of said blank to form a junction therein, masking a narrow strip of the oxide layer remaining on the bottom of said blank adjacent said diffused area and overlying the area where said junction comes to the surface of said blank, removing the oxide layer from the remaining unmasked portion of said bottom of said blank to form an exposed area, masking said top of said blank to form a grid pattern thereon, and plating said grid pattern, the end and minor bottom portion of said blank and the exposed area of said bottom with a conductive material to form ohmic contacts to the two conductivity regions of said blank, said contacts being separated and prevented from shorting said junction by the remaining oxide strip.

References Cited

UNITED STATES PATENTS

| | | | |
|---|---|---|---|
| 2,981,877 | 4/1961 | Noyce | 317—235 |
| 3,147,152 | 9/1964 | Mendel | 148—1.5 |
| 3,158,788 | 11/1964 | Last | 317—101 |
| 3,212,162 | 10/1965 | Moore | 29—25.3 |

WILLIAM I. BROOKS, *Primary Examiner.*

JOHN F. CAMPBELL, *Examiner.*